(12) United States Patent
Babbs et al.

(10) Patent No.: US 6,326,755 B1
(45) Date of Patent: Dec. 4, 2001

(54) SYSTEM FOR PARALLEL PROCESSING OF WORKPIECES

(75) Inventors: Daniel Babbs; Timothy Ewald, both of Austin; Matthew Coady, Round Rock; Jae Kim, Austin, all of TX (US)

(73) Assignee: Asyst Technologies, Inc., Fremont, CA (US)

( * ) Notice: Subject to any disclaimer, the term of this patent is extended or adjusted under 35 U.S.C. 154(b) by 0 days.

(21) Appl. No.: 09/547,551

(22) Filed: Apr. 12, 2000

(51) Int. Cl.$^7$ ........................................................ B25J 9/22
(52) U.S. Cl. ................................ 318/568.21; 318/568.11; 318/568.15; 318/573; 901/9; 901/45; 901/8
(58) Field of Search ........................... 318/568.21, 568.11, 318/568.15, 573; 901/9, 45, 8; 414/744.5, 749

(56) References Cited

U.S. PATENT DOCUMENTS

| | | | |
|---|---|---|---|
| 4,676,002 | * | 6/1987 | Slocum ...................................... 901/9 |
| 5,920,679 | * | 7/1999 | Ge et al. .......................... 318/568.15 |
| 6,155,768 | * | 12/2000 | Bacchi et al. .............................. 901/8 |

* cited by examiner

*Primary Examiner*—Karen Masih
(74) *Attorney, Agent, or Firm*—Fliesler Dubb Meyer & Lovejoy LLP

(57) ABSTRACT

A dual paddle end effector robot is disclosed which is capable of parallel processing of workpieces. The end effector includes a lower paddle rotatably coupled to an end of the distal link, and an upper paddle rotatably coupled to the lower paddle. The lower paddle supports a drive assembly capable of rotating the upper paddle with respect to the lower paddle. In one embodiment of the present invention, the dual paddle end effector robot may be used within a wafer sorter to perform parallel processing of workpieces on a pair of aligners within the sorter. In such an embodiment, the robot may first acquire a pair of workpieces from adjacent shelves within the workpiece cassette. After withdrawing from the cassette, the respective paddles on the end effector may fan out and transfer the wafers to the chucks of the respective aligners. After processing of the workpieces on the aligners is complete, the fanned end effector paddles may re acquire the workpieces, the upper paddle may return to its home position located directly over the lower paddle, and then return the processed workpieces to their original cassette or to a new cassette. Parallel processing of workpieces in this fashion provides significantly greater throughput than in conventional wafer sorter systems. Throughput may be improved still further by providing buffering locations for the workpieces at the respective aligners.

32 Claims, 13 Drawing Sheets

SYSTEM FOR PARALLEL PROCESSING OF WORKPIECES

CROSS-SECTION TO RELATED PATENTS/APPLICATIONS

The present application is related to the following patents/applications, which are assigned to the owner of the present invention and which are incorporated in their entirety herein:

U.S. patent application Ser. No. 09/547,829, entitled "MODULAR SORTER", by Babbs et al., filed on Apr. 12, 2000, which application is currently pending; and U.S. patent application Ser. No. 09/452,059, entitled "WAFER ORIENTING AND READING MECHANISM", filed on Nov. 30, 1999, which application is currently pending.

BACKGROUND OF THE INVENTION

1. Field of the Invention

The present invention relates to a system for transferring and sorting workpieces, and in particular to a transfer and sorting system including a robot having a dual paddle end effector capable of affecting parallel processing of workpieces.

2. Description of Related Art

The introduction of workpiece handling robots into the semiconductor fabrication process represented a significant advance in automation over manual and early transfer equipment for moving workpieces such as semiconductor wafers between various processing tools and/or workpiece storage locations. It is an important feature of conventional workpiece handling robots to be able to quickly and precisely acquire a workpiece from a first position, deliver it to a new location having different X, Y and Z coordinates in Cartesian space, and set it down without risk of damage to the workpiece.

In order to accomplish this, a typical robot includes a central mast mounted in a base for translation along a vertical axis. A proximal arm, or link, is rotatably mounted to an upper end of the mast, and a distal arm, or link, is rotationally mounted to the opposite end of the proximal link. The wafer handling robot further includes an end effector attached to the distal link for supporting the workpiece. The end effector is pivotally mounted to the distal link for synchronized motion with the distal and proximal links. Various motors are further provided, conventionally mounted in the base, for translating the central mast, and for rotating the proximal and distal links such that the end effector may be controllably maneuvered in three-dimensional space.

In addition to their use in processing tools for forming the integrated circuits on the wafers, workpiece handling robots are used in stand alone processing tools such as for example wafer sorters. Wafer sorters are used for a variety of purposes in a fab, such as for example to transfer one or more wafers between various cassettes positioned on the wafer sorter. During this process, wafers from a number of cassettes can be combined into one cassette, and wafers from one cassette can alternatively be split up among a number of cassettes. The wafers can also be transferred between the cassettes in the same order or reordered as desired. Another function of a wafer sorter is to map the location of wafers within a cassette, and to detect incorrect positioning of wafers within a cassette.

A wafer sorter may further include an aligner. Conventional aligners have a chuck for supporting and rotating a wafer and typically two cameras, one for identifying a radial runout (i.e., a magnitude and direction by which the workpiece deviates from an expected centered position on the chuck), and for identifying the position of a notch located along the circumference of the wafer. An aligner typically includes a second camera for reading an optical character recognition (OCR) mark which identifies the workpiece. In a conventional wafer sorter, wafers are transferred one at a time to the chuck of the aligner which then rotates the wafer to determine the radial runout, identify the location of the notch, and to read the OCR mark. The wafers are then returned one at a time to the wafer cassette. Conventional aligner/robot systems which transfer workpieces one at a time between the workpiece cassette and aligner have a relatively low throughput, on the order of approximately 200–250 wafers per hour. This low throughput is significant as the alignment process must be performed for each processing station where an indicial mark reading is required, and must be performed on each individual wafer at each of these stations.

It is known to provide robots having two separate sets of robotic arms, or links, to increase throughput. One such multiple armed robot is disclosed in U.S. Pat. No. 5,789,890 to Genov et al. As disclosed therein, such robots typically include end effectors offset from each other so as to be able to obtain a first workpiece from the cassette, spin around, and then acquire a second workpiece. Such robots take up a significant amount of space within the sorter, where space is at a premium owing to the expense of maintaining sorters with ultraclean air. Moreover, typical dual armed robots are expensive, and require complicated controls.

SUMMARY OF THE INVENTION

It is therefore an advantage of the present invention to provide a workpiece handling robot capable of parallel processing of workpieces to improve throughput times.

It is another advantage of the present invention to provide parallel processing of workpieces with relatively minor alteration of a conventional workpiece handling robot.

It is a further advantage of the present invention to provide a versatile workpiece handling robot capable of operating as a dual or single paddle robot.

It is another advantage of the present invention that the aligner does not sit idle while the robot transfers wafers to and from the aligner.

It is a still further advantage of the present invention that the robot does not sit idle while the aligner performs its operations.

These and other advantages are accomplished by the present invention which in preferred embodiments relates to a dual paddle end effector robot capable of parallel processing of workpieces. The robot preferably includes a mast capable of vertical translation into and out of a robot base, a proximal link fixedly mounted to the mast, and a distal link rotatably coupled to the proximal link. The robot further includes an end effector rotatably coupled to the proximal link, which end effector includes a pair of workpiece support paddles capable of rotating with respect to each other.

In particular, the end effector includes a lower paddle rotatably coupled to an end of the distal link, and an upper paddle rotatably coupled to the lower paddle. The lower paddle supports a drive assembly capable of rotating the upper paddle with respect to the lower paddle. The upper and lower paddles are spaced from each other a distance which is preferably equal to the pitch of the workpieces within a cassette with which the robot according to the present invention is operating. Thus, the upper and lower paddles may simultaneously extract a pair of workpieces from shelves within the workpiece cassette.

In one embodiment of the present invention, the dual paddle end effector robot may be used within a wafer sorter to perform parallel processing of workpieces on a pair of aligners within the sorter. In such an embodiment, the robot may first acquire a pair of workpieces from adjacent shelves within the workpiece cassette. After withdrawing from the cassette, the respective paddles on the end effector may fan out and transfer the wafers to the chucks of the respective aligners. After processing of the workpieces on the aligners is complete, the fanned end effector paddles may reacquire the workpieces, the upper paddle may return to its home position located directly over the lower paddle, and then return the processed workpieces to their original cassette or to a new cassette. Parallel processing of workpieces in this fashion provides significantly greater throughput than in conventional wafer sorter systems. Throughput may be improved still further by providing buffering locations for the workpieces at the respective aligners.

BRIEF DESCRIPTION OF THE DRAWINGS

The present invention will now be described with reference to the drawings in which.

DETAILED DESCRIPTION

The present invention will now be described with reference to FIGS. 1–14 which in general relate to a workpiece handling robot for transferring workpieces in parallel between workpiece storage locations and processing tools. It is understood that the workpieces to be transported by the present invention may comprise various flat, planar objects including semiconductor wafers, reticles and flat panel displays. The system and robot according to the present invention may operate with various processing tools within a wafer fab, including for example tools which form integrated circuits on wafers, and tools which identify, reorganize and transfer wafers such as wafer sorters. It is further understood that the system and robot according to the present invention may comply with and allows compliance with all applicable SEMI standards.

Figure 1:
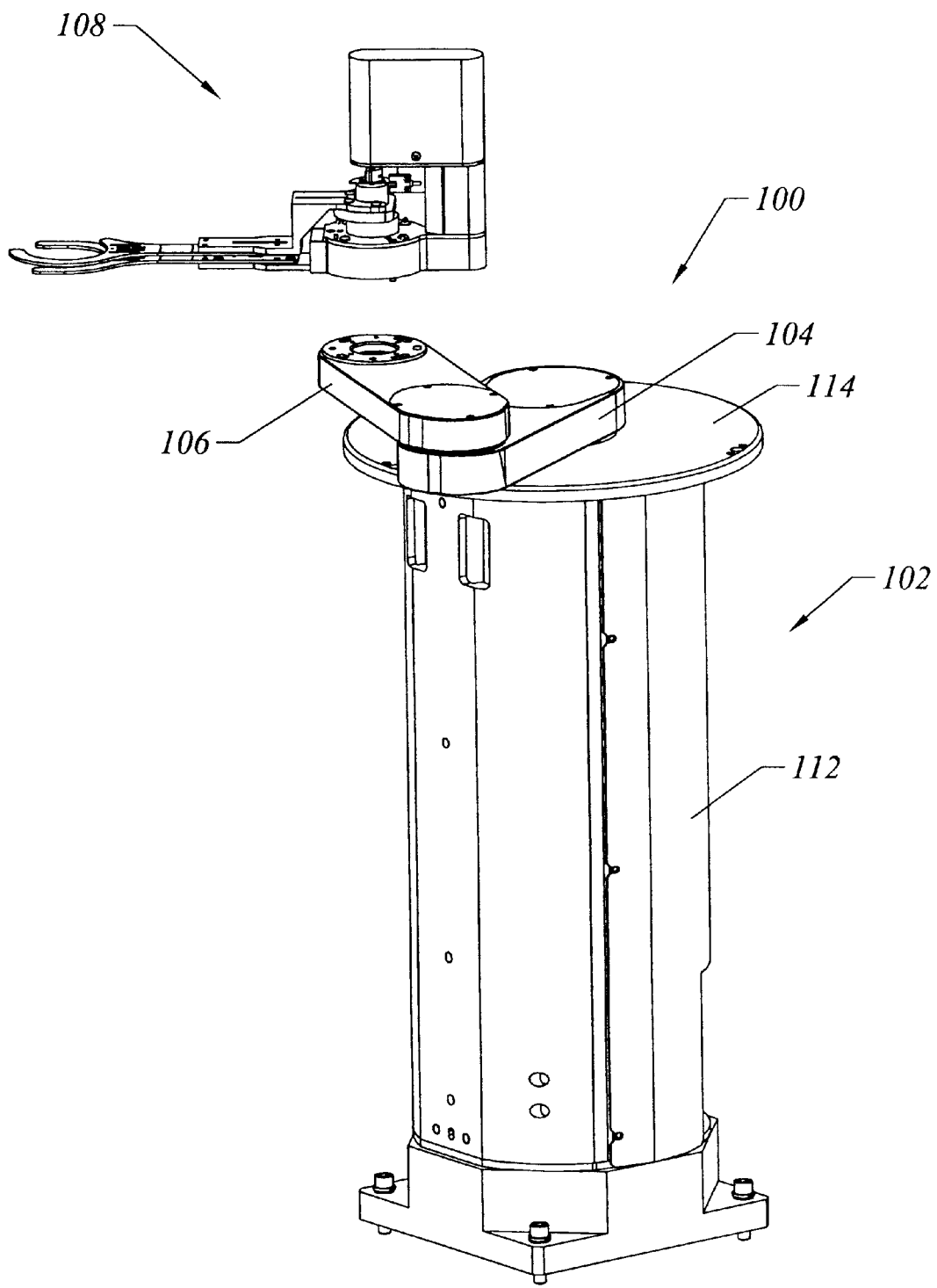
FIG. 1 is a perspective view of a robot including a dual paddle end effector according to the present invention.
Figure 2:
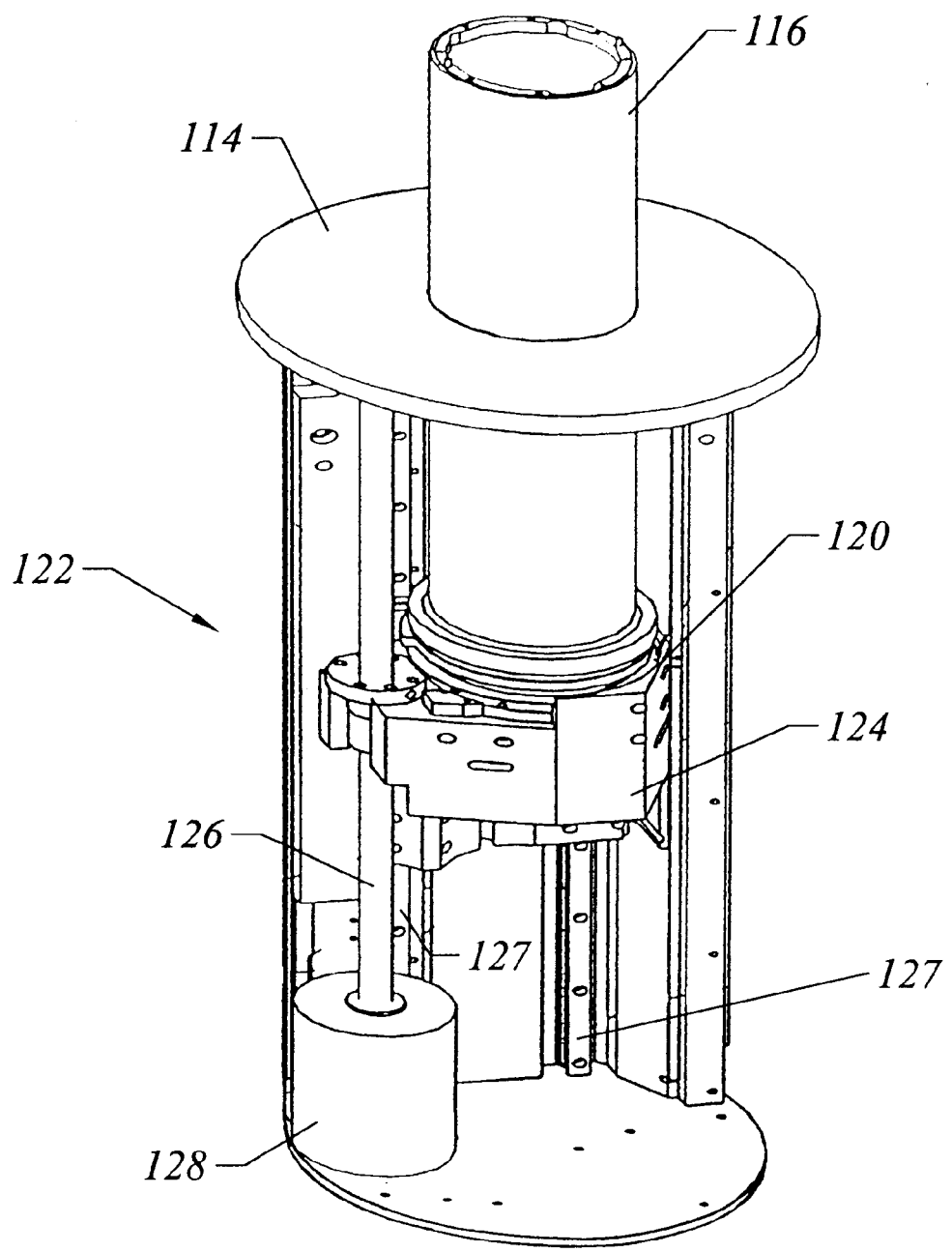
FIG. 2 is a perspective cut away view of the base of the robot.

Referring now to FIGS. 1 and 2, there is shown a robot 100 according to the present invention including a base 102, a proximal link 104, a distal link 106 and an end effector 108 in accordance with the present invention. A mast 116 within the base 102 (shown in FIG. 2 but not in FIG. 1) is capable of translation along the vertical Z-axis into and out of base 102, and the proximal link, distal link and end effector are all capable of pivoting about their respective rotational axes in X-Y planes perpendicular to the Z-axis. As such, the end effector may be maneuvered through three dimensional space in the proximity of robot 100.

It is understood that the base 102, links 104 and 106 as well as the components therein may be of a conventional design. In one embodiment, these components (excluding the end effector 108) are described in U.S. patent application Ser. No. 09/483,625, entitled "WORKPIECEHANDLINGROBOT", incorporated herein by reference. It is understood however that the configuration of the robot components supporting and maneuvering the end effector 108 may vary in alternative embodiments.

With reference still to FIGS. 1 and 2, the base 102 includes a cylindrical housing 112 (shown partially in FIG. 2) that encloses and protects the components within the base. The base 102 further includes a top plate 114 mating with and affixed to a top portion of housing 112. Top plate 114 includes a central hole 115 through which the mast 116 extends and translates. Mast 116 is preferably a hollow cylinder formed of stainless steel tubing of approximately 100 mm outer diameter, 20' long and has a thickness of approximately 0.08'. It is understood that the material and dimensions set forth above for mast 116 may vary in alternative embodiments.

Referring to FIG. 2, the mast is seated on and affixed to a rotating portion of a shoulder drive 120 (explained hereinafter), which drive 120 is in turn supported within a linear drive 122 for translating the drive 120 and the mast 116 linearly along the Z-axis. In particular, linear drive 122 includes a carriage 124 within which the shoulder drive 120 is supported, a ball screw 126 for vertically translating the carriage 124, and a motor assembly 128 for rotating the ball screw 126. Additionally, a pair of rails 127 are affixed within housing 112, and the carriage is in turn translationally affixed to the rails 127 via rollers (not shown).

Figure 3:
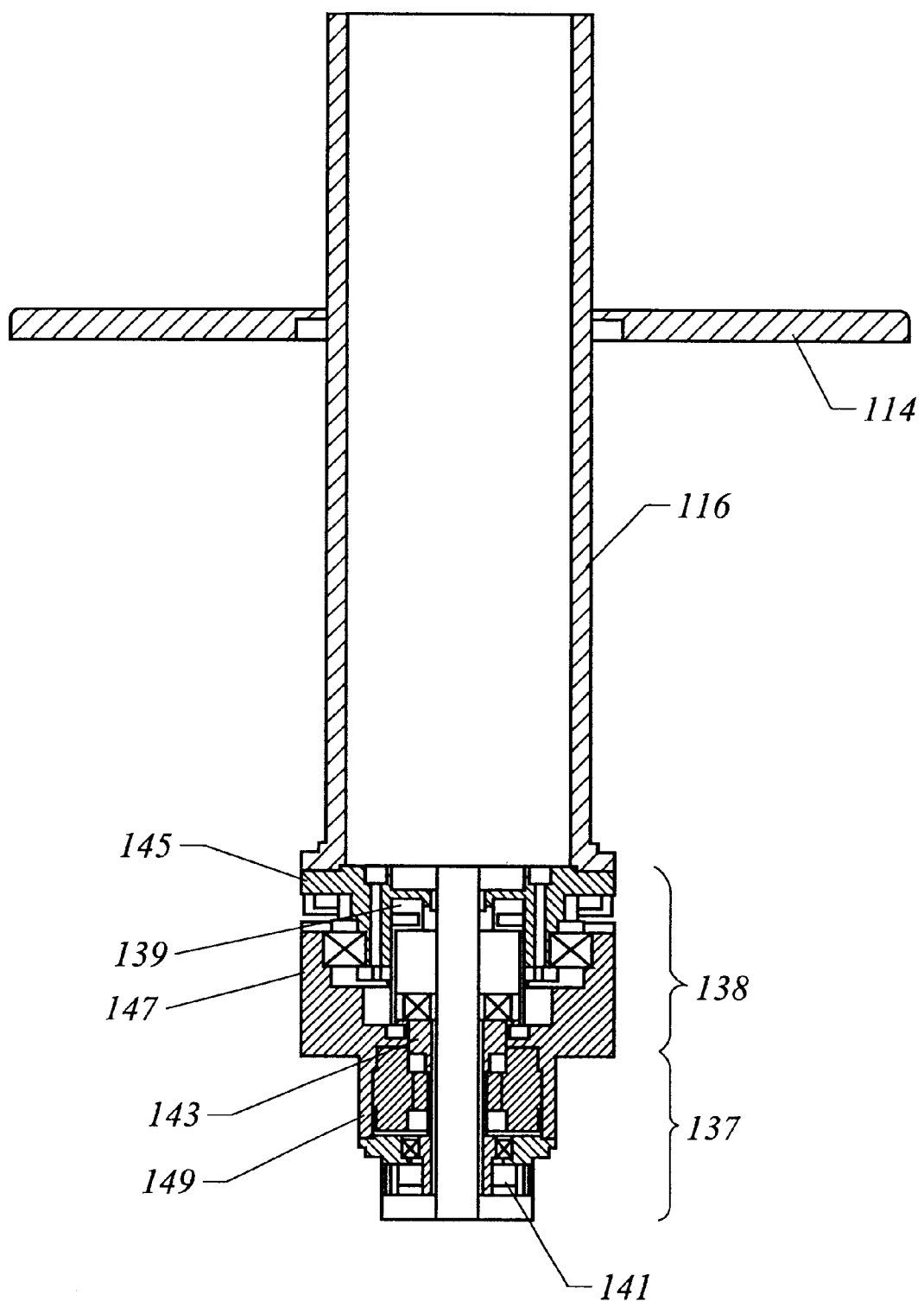
FIG. 3 is a cross-sectional front view of the robot mast and elbow drive assembly.

Referring now to FIGS. 2 and 3, the shoulder drive 120 is provided for rotating the mast 116 and the proximal link 104, which is fixedly mounted to the mast. In a preferred embodiment, shoulder drive 120 comprises a brushless motor 137 coupled to a harmonic drive reduction system 138. The interior wave generator 139 of the harmonic drive reduction system is coupled to the output shaft 143 of motor 137. It is contemplated that the harmonic drive reduction system 138 may reduce the angular velocity, and increase the torque output, of the motor 137 by a ratio ranging from approximately 140:1 to approximately 40:1 in alternative embodiments, and optimally about 50:1.

The mast 116 is coupled to the output spline 145 of the harmonic drive reduction system 138, which in a preferred embodiment is the outermost section of the shoulder drive. The shoulder drive is supported by the carriage 124 via an annular adapter plate 147 fixedly mounted to both the carriage 124 and a stationary motor housing 149 encasing the motor 137. In a preferred embodiment, the rotating output spline 145 of the harmonic drive reduction system 138 is rotationally supported within the carriage 124 by a large cross roller bearing (not shown) surrounding the output spline 145, and mounted between the output spline 145 and the carriage 124.

Figure 4:
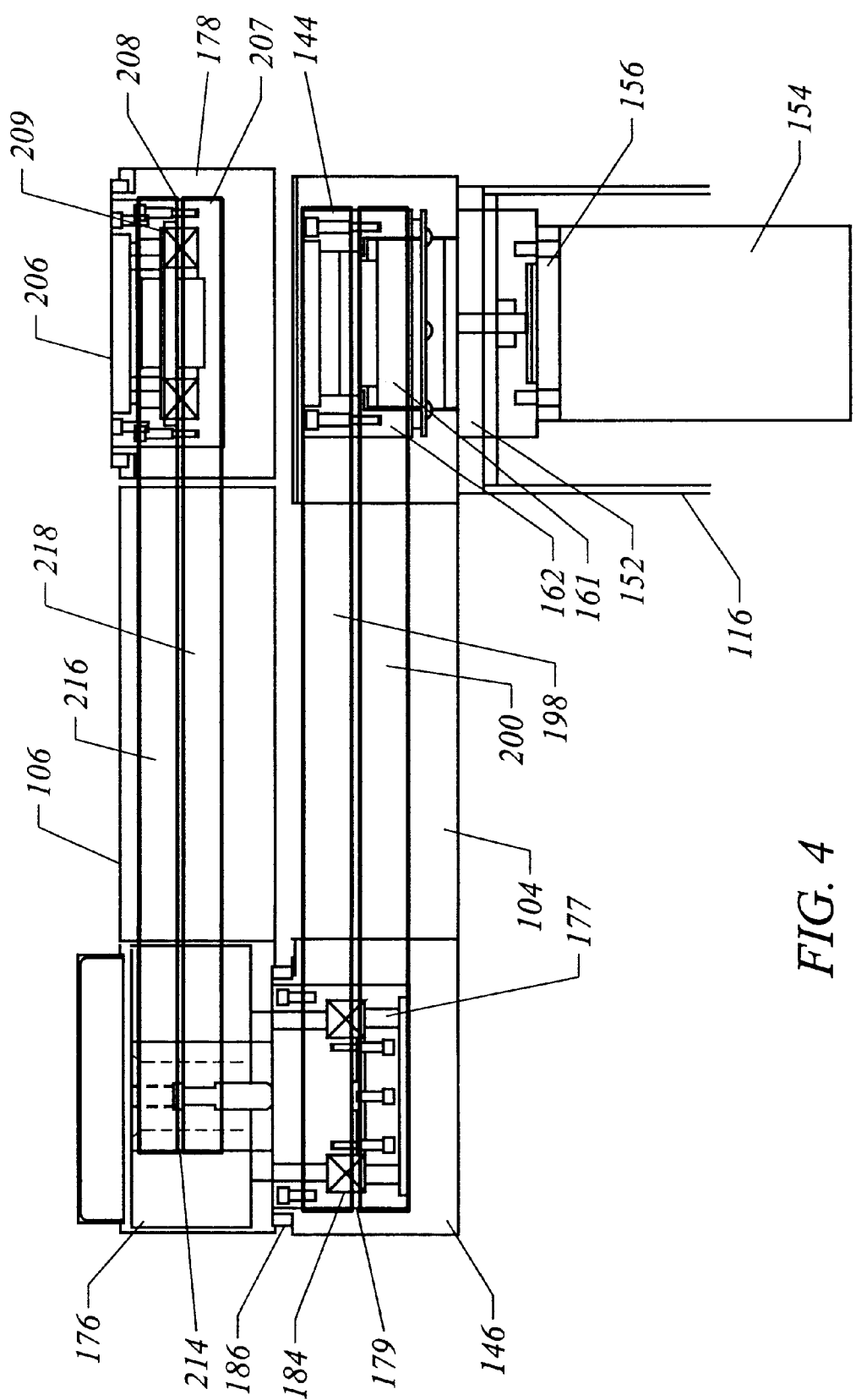
FIG. 4 is a front view of the robot proximal and distal links together with the rotational and drive assemblies contained therein.
Figure 5:
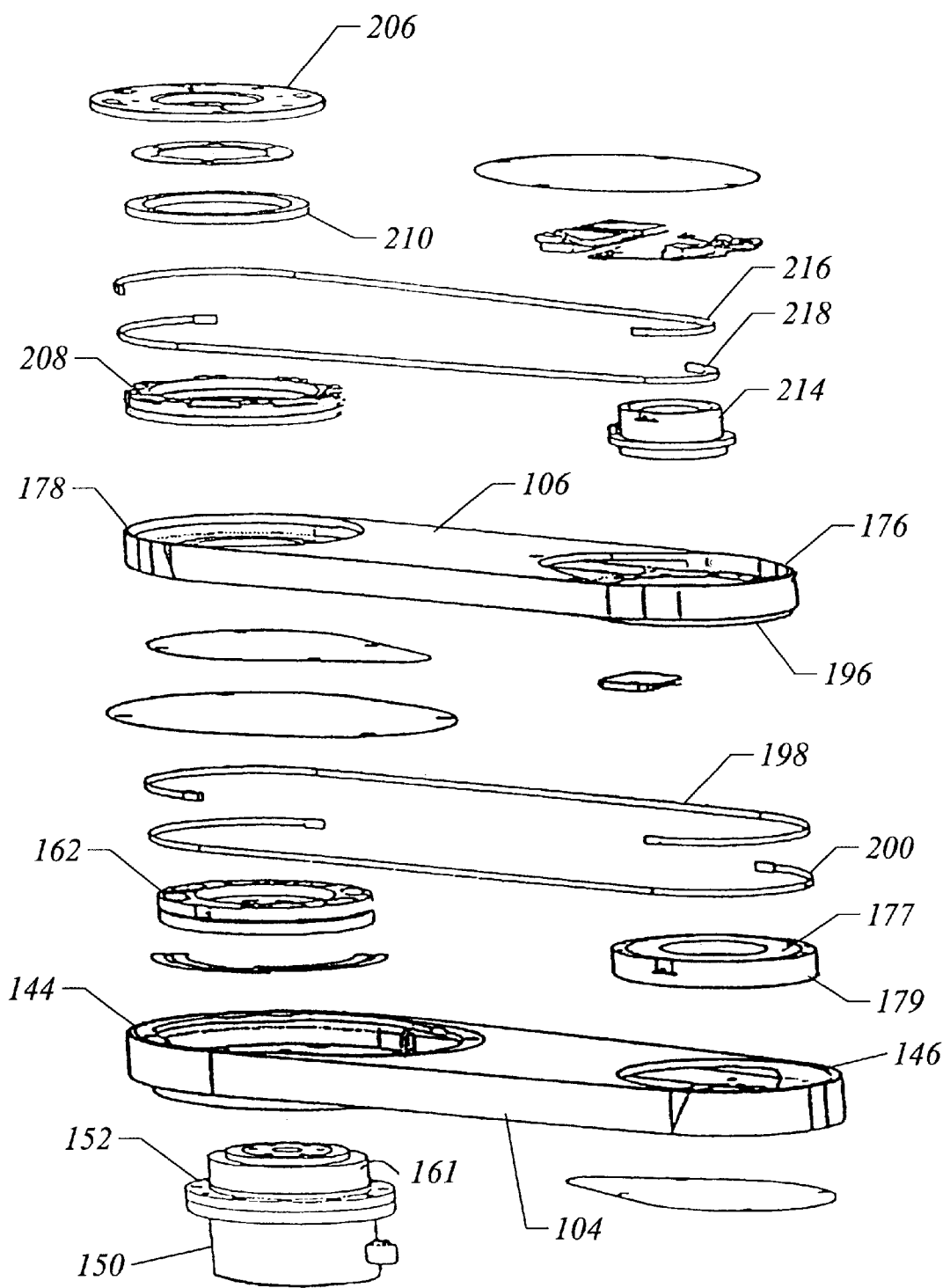
FIG. 5 is an exploded perspective view of the proximal and distal links with the rotational and drive assemblies contained therein.

Referring now to FIGS. 4 and 5, an elbow drive 150 is mounted within the interior of a mounting hub 144 in link 104 and hangs down into the interior of mast 116. In particular, a motor support plate 152 is mounted to a bottom portion of mounting hub 144 to which the elbow drive 150 is affixed. Elbow drive 150 is structurally and operationally similar to shoulder drive 120, and includes each of the attendant advantages discussed above. In particular, the elbow drive 150 preferably includes a brushless motor 154 coupled to a harmonic drive reduction system 156. The interior wave generator of the harmonic drive reduction system is coupled to the output of motor 154. The velocity and torque reduction of drive 150 range from about 140:1 to about 40:1 in alternative embodiments, and is optimally about 50:1 to thereby generate a very stiff, smooth and precise output rotation.

The output spline from the harmonic drive reduction system 156 is affixed to drive boss 161 extending up through a hole in the motor support plate 152. A pulley 162 is in turn affixed over the drive boss 161. Pulley 162 is coupled to the distal link 106 via straps 198, 200 so that rotation of the pulley 162 by the elbow drive 150 rotates the distal link 106 as desired.

It is understood that various configurations are contemplated for rotationally mounting the proximal and distal links to each other. Referring to FIGS. 4 and 5, in a preferred embodiment, a mounting hub 146 of the proximal link 104 may include an annular boss 177 fixedly mounted to, and extending up from, a bottom of the mounting hub 146. A lower pulley 179 may be rotationally mounted around the boss 177 by large cross roller bearings 184 mounted between the boss 177 and the lower pulley 179. The lower pulley 179 is fixedly mounted to the distal link 106 so that rotation of the lower pulley 179 by the elbow drive 150 causes rotation of the distal link 106. The cross roller bearings 184 provide radial and axial stability and prevent any tilting of the axis of rotation of the distal link with respect to the proximal link. An annular seal 186 is preferably provided between the proximal and distal links to prevent gas or liquid from the external environment from entering in between the proximal and distal links.

The rotation of the distal link 106 by the elbow drive 150 will now be described with respect to FIGS. 4 and 5. First and second straps 198 and 200 are affixed at one end to pulley 162 of the elbow drive 150, and affixed at their opposite end around lower pulley 179 in the mounting hub 146. The respective straps 198 and 200 lie in different, non-overlapping horizontal planes, and are wrapped around the respective pulleys 162, 179 so that the pulleys can rotate approximately 160° in either direction without completely unwrapping the straps from about the pulleys. It is understood that the angle through which the pulleys may rotate in either direction may be greater or lesser than 160° in alternative embodiments, with the provision that the angle be approximately equal to or less than 180°. Moreover, while the straps are metal in a preferred embodiment, they may be formed of other materials in alternative embodiments. Such materials include synthetic polymers such as Kevlar® and Nylon®.

Rotation of pulley 162 in a first direction will pull on one of the straps, for example strap 198, to rotate the lower pulley and consequently the distal link affixed thereto, in a first direction. As this occurs, the strap 200 remains under tension to prevent overshooting the desired link rotation and to minimize settling time (i. e., the time it takes for any oscillation in the link to settle out), if any. Similarly, rotation in the drive pulley in the opposite direction will for example pull on strap 200 to rotate the lower pulley and distal link in the opposite direction. Again, as this occurs, the strap 198 remains under tension to prevent overshooting the desired link rotation and to minimize settling time, if any.

End effector 108 is rotationally mounted to an end of distal link 106 opposite the end mounted to the proximal link. As with the rotational mounting of the distal link to the proximal link, it is understood that various configurations are contemplated for rotationally mounting the end effector 108 to the distal link 106. In a preferred embodiment, except as noted below, the end effector is rotationally mounted to the distal link in substantially the same manner that the distal link is rotationally mounted to the proximal link. It is understood that the configuration for mounting the distal link to the proximal link may be different than the configuration for mounting the end effector to the distal link in alternative embodiments.

In a preferred embodiment, the end effector 108 may be rotationally mounted to the distal link by affixing the end effector 108 to an end effector mounting plate 206 rotationally mounted within the mounting hub 178 of the distal link 106. In order to rotationally mount the plate 206 within the mounting hub 178, the mounting hub 178 of the distal link 106 may include an annular boss 207 fixedly mounted to, and extending up from, a bottom of the mounting hub 178. A pulley 208 may be rotationally mounted around the boss 207 by large cross roller bearings 209 mounted between the boss 207 and the pulley 208. The end effector mounting plate is fixedly mounted on top of the pulley 208 so as to rotate with the pulley 208. An annular seal 210 is preferably provided between the distal link 106 and the end effector 108 to prevent gas or liquid from the external environment from entering in between these components, and to prevent particulates generated by robot motion from escaping into the environment surrounding the robot. It is understood that seal 210 may be omitted in alternative embodiments.

In order to transfer torque from the distal link to the end effector, an upper pulley 214 is fixedly mounted to the boss 177 in the mounting hub 146 of the proximal link 104, and extends upward therefrom so as to be positioned within the mounting hub 176 of the distal link 106. The upper pulley is constrained to rotate with the boss, which is in turn fixedly mounted to the distal end of the proximal link.

In order to rotate the end effector mounting plate 206 and end effector 108, first and second steel straps 216 and 218 are affixed at one end to upper pulley 214, and affixed at their opposite end around pulley 208. The ends of the straps 216, 218 are affixed to the pulleys 214 and 208 to prevent slipping of the straps upon rotation of upper pulley 214 relative to the distal link 106 (as previously indicated, pulley 214 is fixedly mounted to proximal link 104, and pulley 214 rotates upon rotation of the proximal link 104). The respective straps 216 and 218 are structurally similar and operate in the same manner as straps 198 and 200 described above so that the end effector 108 rotates upon rotation of the distal link 106.

As previously indicated, the above-described components for maneuvering the end effector may be of known construction and may comprise various other configurations in alternative embodiments.

Figure 6:
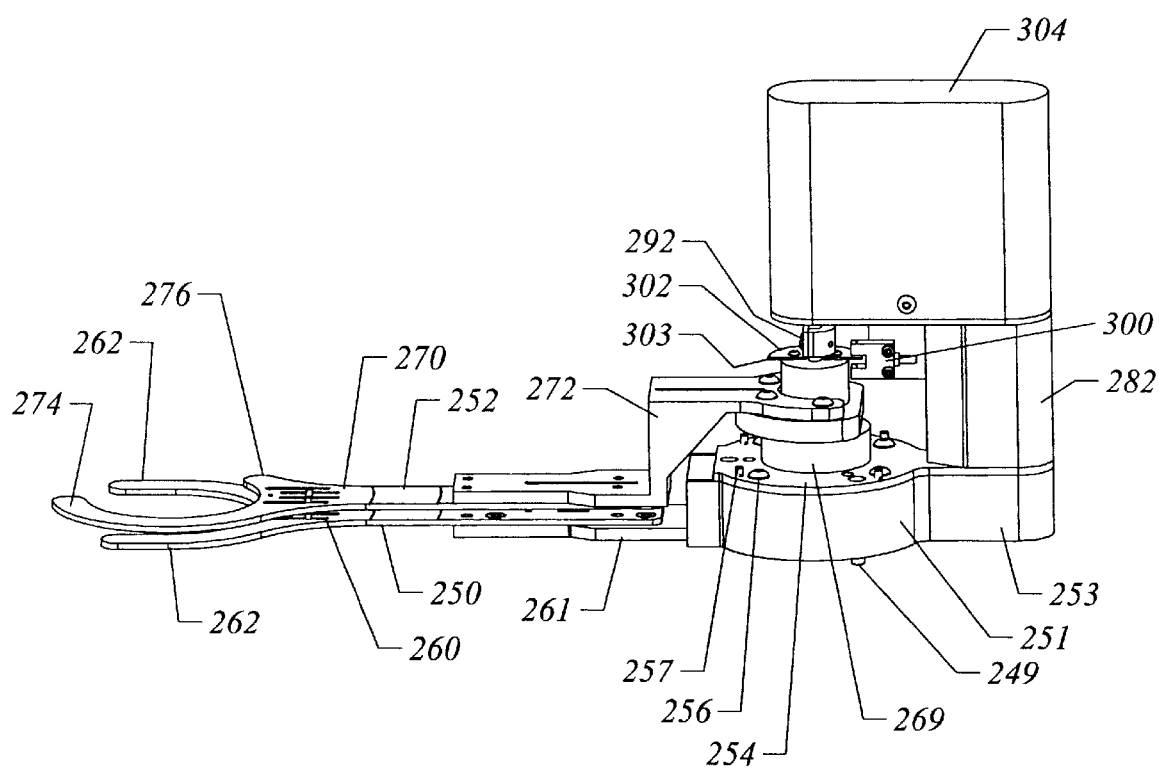
FIG. 6 is an enlarged perspective view of the dual paddle end effector according to the present invention.
Figure 7:
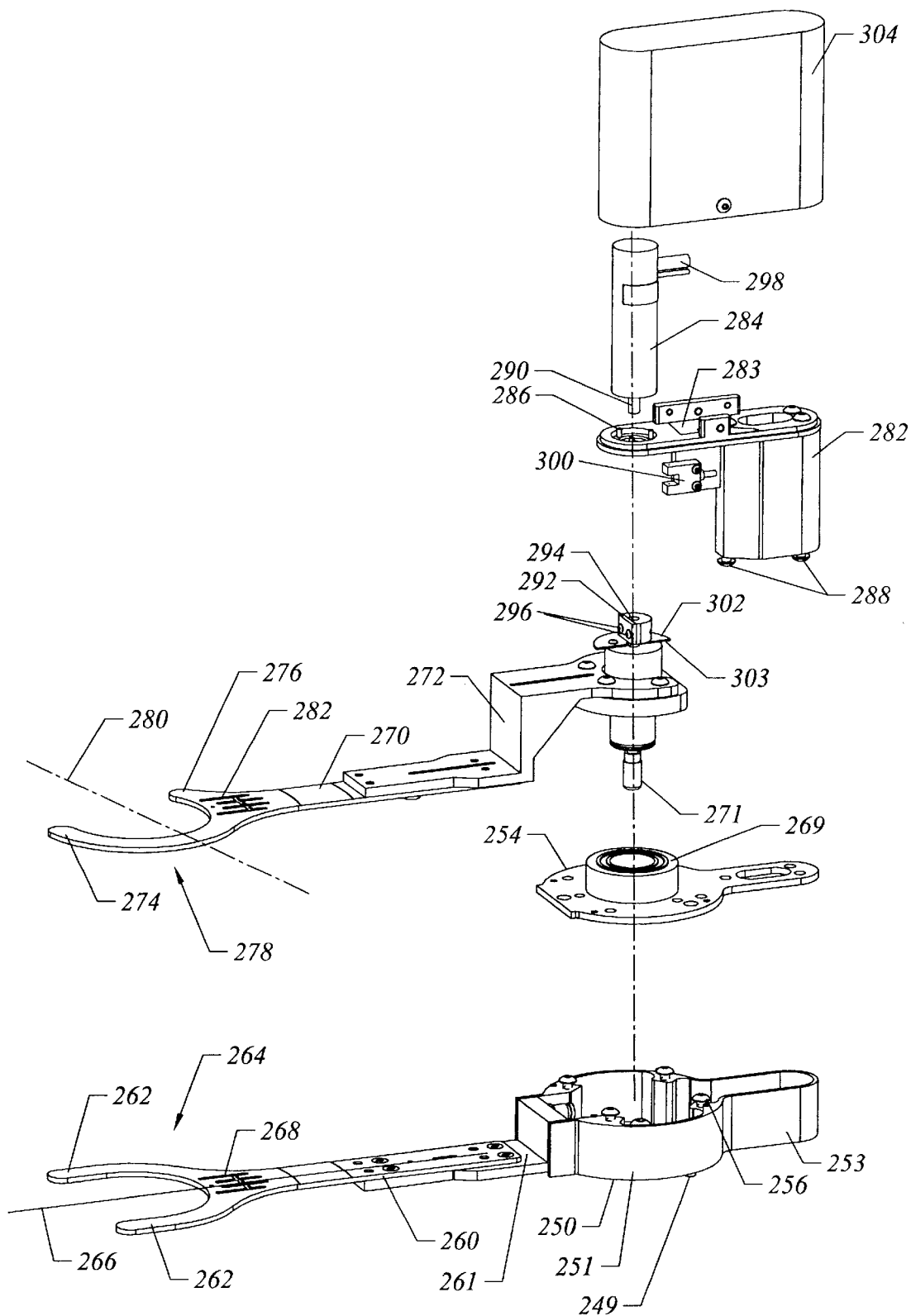
FIG. 7 is an exploded perspective view of the dual paddle end effector according to the present invention.

Referring now to FIGS. 6 and 7, in accordance with the present invention, end effector 108 includes lower paddle 250 and upper paddle 252, which paddles are capable of rotating with respect to each other. Lower paddle 250 is fixedly attached to mounting plate 206 so as to rotate with mounting plate 206 upon rotation of the distal link as described above. Screws 249 (only one shown) extend through a bottom surface of a lower paddle base 251 and into plate 206 to secure the paddle 250 to the plate 206. The lower paddle 250 further includes a rear extension 253 extending from base 251 to which is mounted a support post 282 for supporting an upper paddle drive assembly as described hereinafter.

Lower paddle 250 further includes a substantially planar blade 260, mounted to an upper surface of a bracket 261, for supporting and transferring the workpieces. The blade 260 may include vacuum ports 268 for communicating a low pressure through to the surface of the blade 260 to securely support the workpieces on blade 260 during transport. Vacuum lines (not shown) from a vacuum source (not shown) may be threaded through the robot and connected to the vacuum ports 268 to generate the low pressure at the upper surface of blade 260.

The blade 260 may further include a pair of fingers 262 defining a substantially "U" shaped end 264. The configuration and orientation of the fingers 262 on the lower blade 260 allow the blade to acquire a workpiece while moving along an axis 266, which axis is substantially parallel to a major longitudinal axis of the lower paddle 250. The fingers 262 further allow the center of gravity of a workpiece supported on paddle 250 to be located inward from an end of the paddle so that the workpiece will remain stationarily supported on paddle 250 in the event the low pressure generated through vacuum ports 268 shuts down.

A cover plate 254 is affixed to the lower paddle base 251 by mounting screws 256 and jack screws 257. The planarity of cover plate 254 may be adjusted rotating each of the jack screws 257 independently and, when the proper planarity of the cover plate is established, mounting screws 256 are tightened down to secure the cover plate 254 to base 251 in the desired position. The cover plate 254 further includes an opening into which a stationary portion of cross roller bearings 269 is fixedly mounted. Upper paddle 252 is in turn fixedly mounted to a rotational portion of bearings 269, thus allowing upper paddle 252 to rotate with respect to lower paddle 250. The leveling screws 257 allow adjustment of the planarity of the cover plate 254, bearing 269 and upper paddle 252 to ensure that the upper and lower paddles rotate in parallel, horizontal planes.

Upper paddle 252 includes a substantially planar blade 270, mounted to a lower surface of a bracket 272, for supporting and transferring workpieces. The blade 270 may include vacuum ports 282 for communicating a low pressure through to the surface of the blade 270 to securely support the workpieces thereon during transport. The above-discussed vacuum lines may be connected to a vacuum fitting 271 extending through the bearing 269, and connections (not shown) in turn communicate the low pressure to the vacuum ports 282 to generate the low pressure at the surface of blade 270.

The blade 270 further includes a first, elongate finger 274 and a second, short finger 276 which together define a substantially "C" shaped end 278. The configuration and orientation of the fingers 274, 276 on the blade 270 allow the blade to acquire a workpiece while moving along an axis 280, which axis is substantially non-parallel to a major longitudinal axis of the upper paddle 252. The fingers 274, 276 further allow the center of gravity of a workpiece supported on paddle 252 to be located inward from an end of the paddle so that the workpiece will remain stationarily supported on paddle 252 in the event the low pressure generated through vacuum ports 282 shuts down.

The cassettes in which the workpieces are supported include shelves which support the workpieces at a pre-defined space, or pitch, from each other. This pitch is defined by SEMI and varies depending on the size of the cassette being used. The brackets 261 and 272 define a spacing between the upper and lower support sections 260,270 which is preferably equal to the pitch of the workpieces within the cassettes with which robot 100 operates. Thus, as explained in greater detail below, the upper and lower paddles may simultaneously extract a pair of workpieces from adjacent shelves in the workpiece cassette.

As indicated above, a mounting post 282 is affixed to the rear portion 253 of base 251. Mounting post 282 is provided for supporting an upper paddle drive assembly 284 mounted within an opening 286. The drive assembly 284 may be press fit into opening 286 and/or may be secured within opening 286 by screws or other fasteners. Mounting post 282 is fixedly mounted to the lower paddle 250 as by screws 288 so that mounting post 282 and drive 284 rotate with the lower paddle 250.

In a preferred embodiment, drive 284 is similar to the shoulder drive 120 and elbow drive 150 described above. The drive 284 preferably includes a brushless motor coupled to a harmonic drive including an output spline 290. The velocity and torque reduction of drive 284 range from about 140:1 to about 40:1 in alternative embodiments, and is optimally about 50:1 to thereby generate very stiff, smooth and precise output rotation of the output spline.

Output spline 290 is in turn affixed within clamp 292 fixedly mounted to upper paddle 252. In particular, output spline 290 may fit within an opening 294 in the clamp, and a pair of set screws 296 may be tightened through a plate and into the clamp to secure the upper paddle 252 to the drive 284. Upon receipt of the appropriate signals from the controller via electrical connection 298, drive 284 can rotate upper paddle 252 with respect to lower paddle 250 across a broad range of motion. In one embodiment of the present invention, the upper paddle may rotate ±145° from its position directly over the lower paddle. It is understood that the rotational range of the upper paddle with respect to the lower paddle may be lesser or greater than that in alternative embodiments.

In a preferred embodiment, mounting post 282 may further include an optical sensor 300 which may be a conventional break-the-beam sensor. Upper paddle 252 further includes a semicircular flag 302 having a straight edge 303. The flag 302 is fixedly mounted to and rotates with upper paddle 252, and rotates within a space between a transmitter and receiver of the sensor 300 so as to be capable of blocking the beam transmitted from the transmitter to the receiver.

During rotation of the upper paddle with respect to the lower paddle, the sensor detects the straight edge 303 of the flag 302 so as to allow determination of a "home" position of the upper paddle over the lower paddle, i.e., a position where the upper paddle is aligned directly over the bottom paddle. In particular, the controller can determine initially whether the upper paddle is rotated in the clockwise or counterclockwise position based on whether the beam is blocked or not. If the upper paddle is for example in a clockwise rotated position with respect to the lower paddle shown in FIG. 6, the beam is blocked, which indicates to the controller that the upper paddle is in the clockwise rotated position and must rotate in the counterclockwise direction to locate the upper paddle in the home position. At some point during the counterclockwise rotation, the straight edge 303 of the flag 302 passes under the sensor 300 so that the beam is then received in the sensor receiver. Conversely, if the upper paddle is for example in a counterclockwise rotated position with respect to the lower paddle shown in FIG. 6, the beam is not blocked, which indicates to the controller that the upper paddle is in the counterclockwise rotated position and must rotate in the clockwise direction to locate the upper paddle in the home position. At some point during the clockwise rotation, the straight edge 303 of the flag 302 passes under the sensor 300 so that the beam is blocked from being received in the sensor receiver.

With the above system, when the sensor 300 changes states (either by the beam going from being blocked to not being blocked or visa-versa), the controller can identify the home position of the upper paddle over the lower paddle. This home position will either be the position of the upper paddle when the sensor 300 changes states, or a known offset from the position of the upper paddle when the sensor 300 changes states. This known offset may be accomplished by driving the motor of the drive 284 a fixed number of motor counts after the sensor 300 changes states. As would be appreciated by those of skill in the art, various other known sensors and systems may be substituted for that described above for indicating the home position of the upper paddle 252 with respect to the lower paddle 250 in alternative embodiments.

A printed circuit board 283 may further be mounted to a top surface of mounting post 282. Board 283 may include electrical terminals for providing a junctions for the electrical connections between the drive 284 and the controller 108. The board 283 may further control and/or transfer signals from the sensor 300.

The drive 284 may be housed within a cover 304 which mounts to an upper surface of mounting post 282 to isolate drive 284 and any particulates generated thereby within the cover 304. Although not shown, a continuous vacuum source may be connected through cover 304 to generate a low pressure within cover 304 to prevent particulates within cover 304 from escaping to the surrounding environment.

Figure 8:
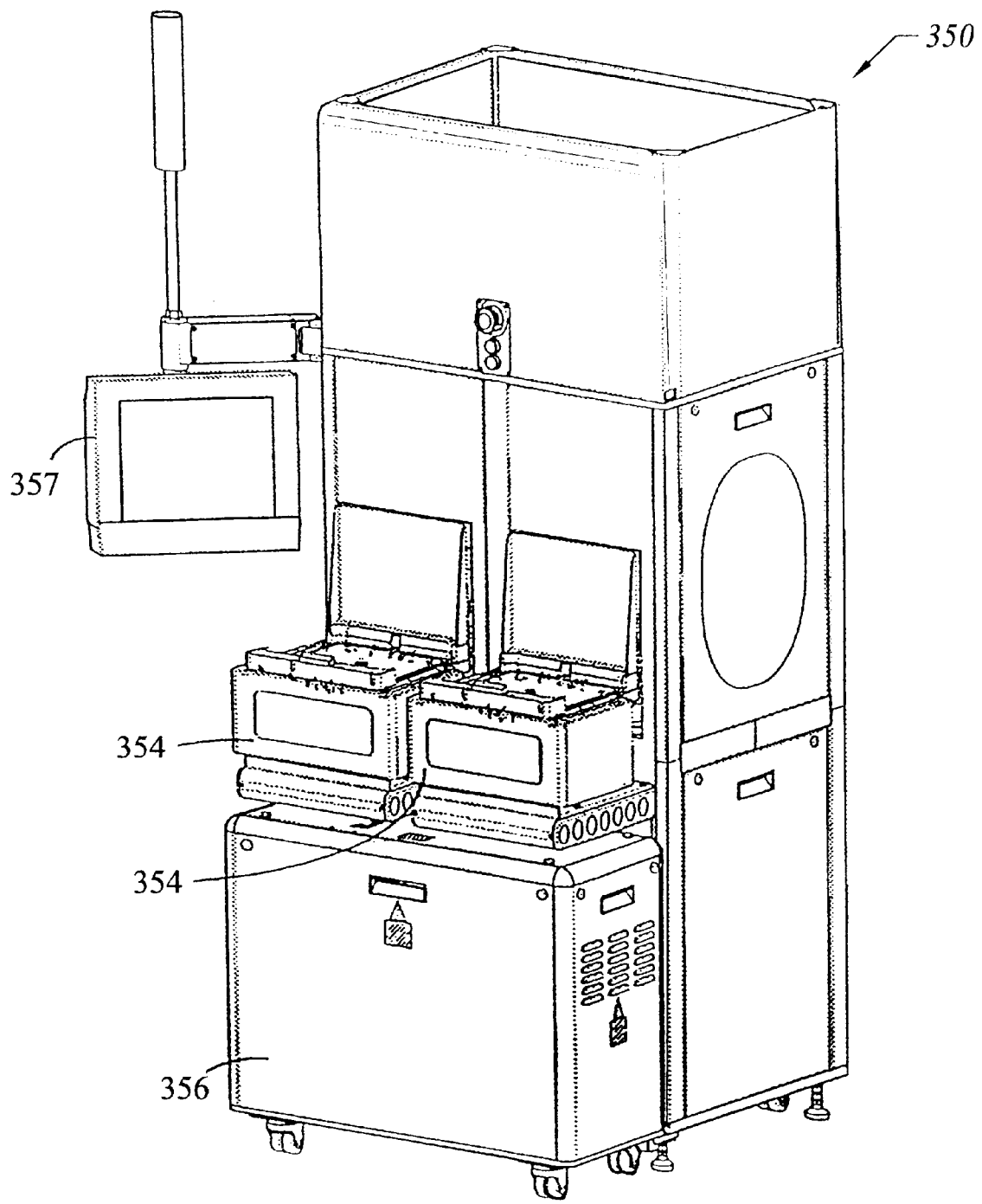
FIG. 8 is a front perspective view of a wafer sorter in which the robot according to the present invention may be used.
Figure 9:
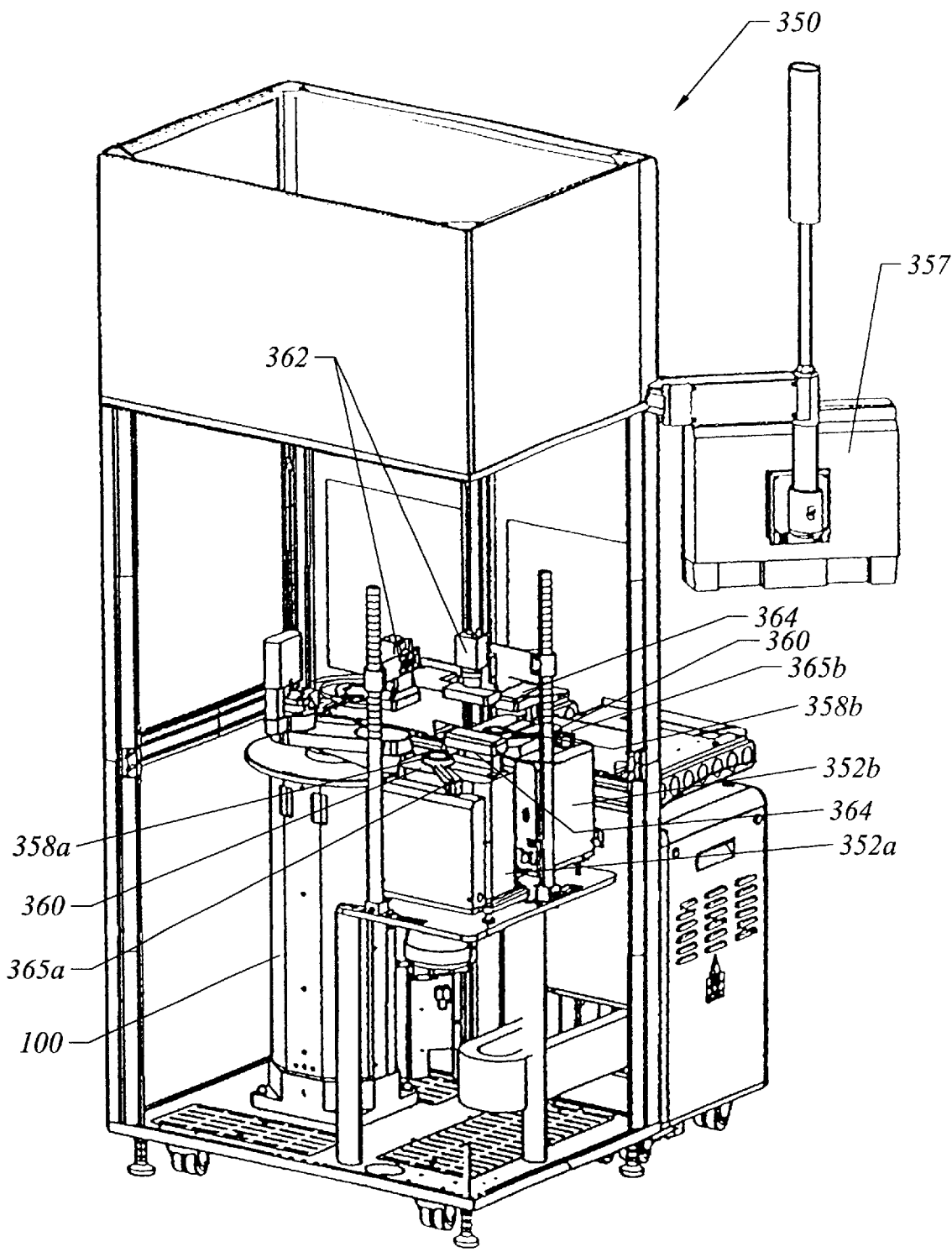
FIG. 9 is a rear cut away perspective view of the wafer sorter shown in FIG. 8.
Figure 10:
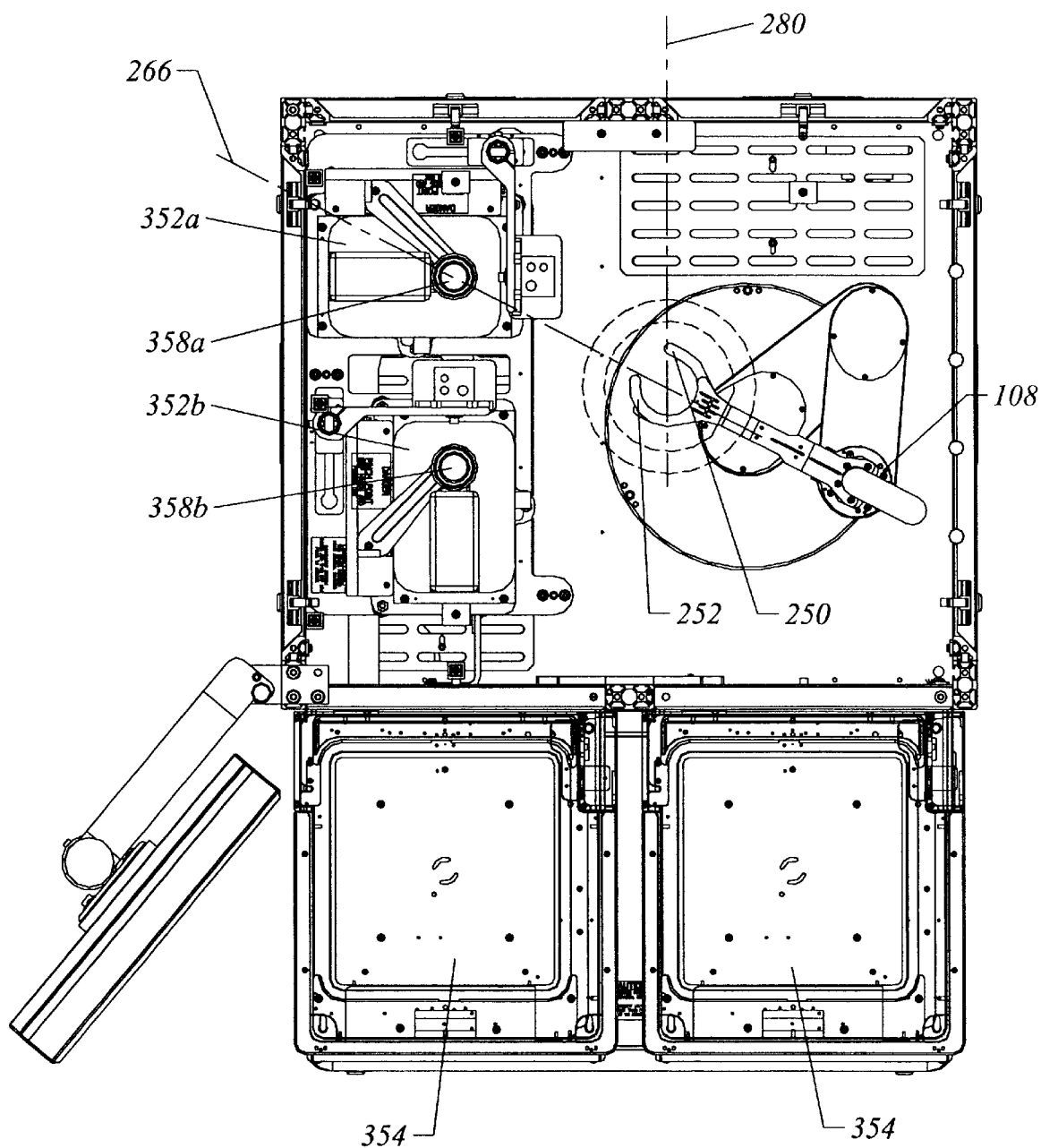
FIG. 10 is a top view of a wafer sorter showing the robot according to the present invention having extracted a pair of workpieces from workpiece cassettes positioned on the sorter.
Figure 11:
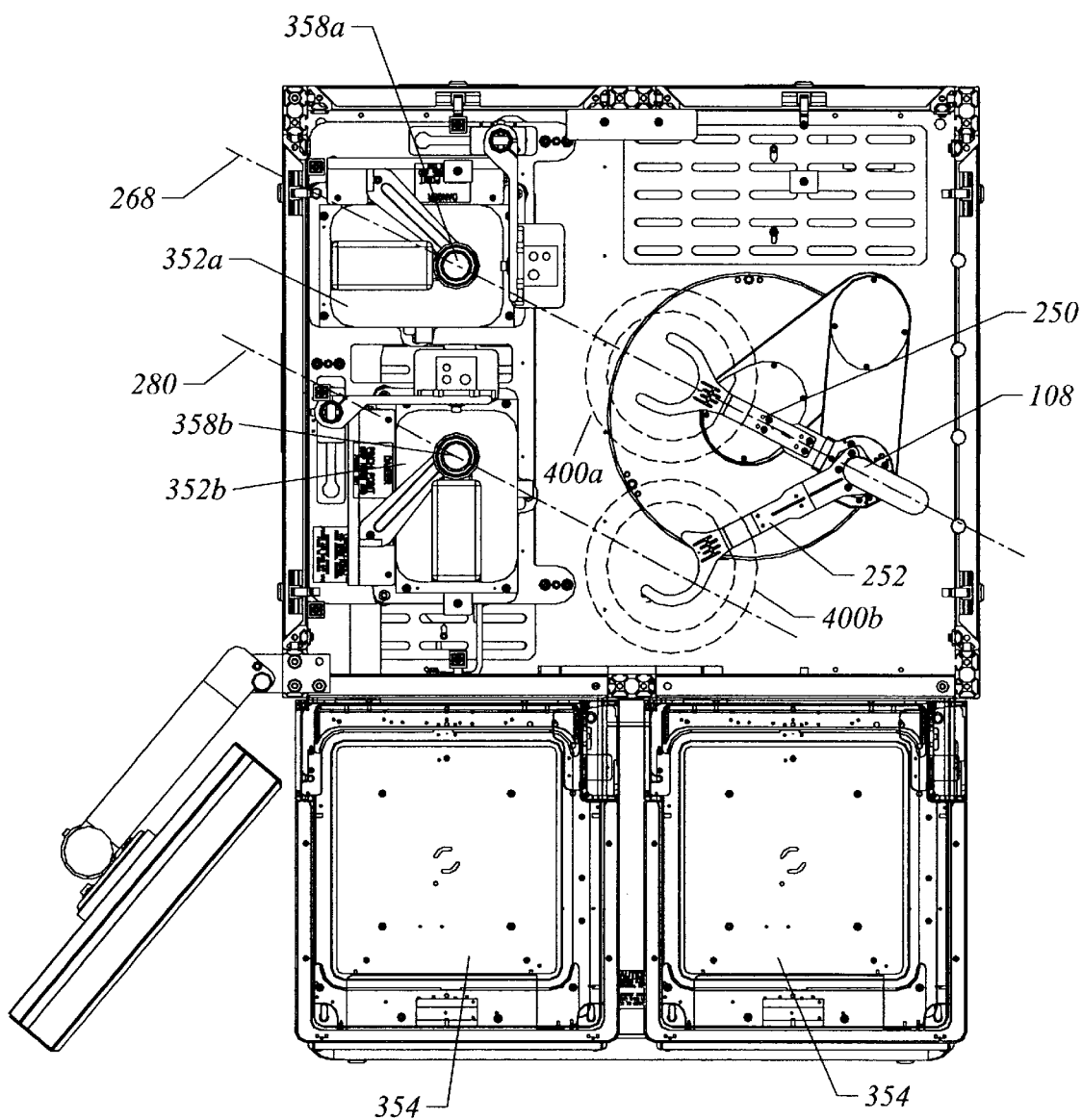
FIG. 11 is a top view of a wafer sorter including a robot according to the present invention with the paddles of the end effector fanned outward.
Figure 12:
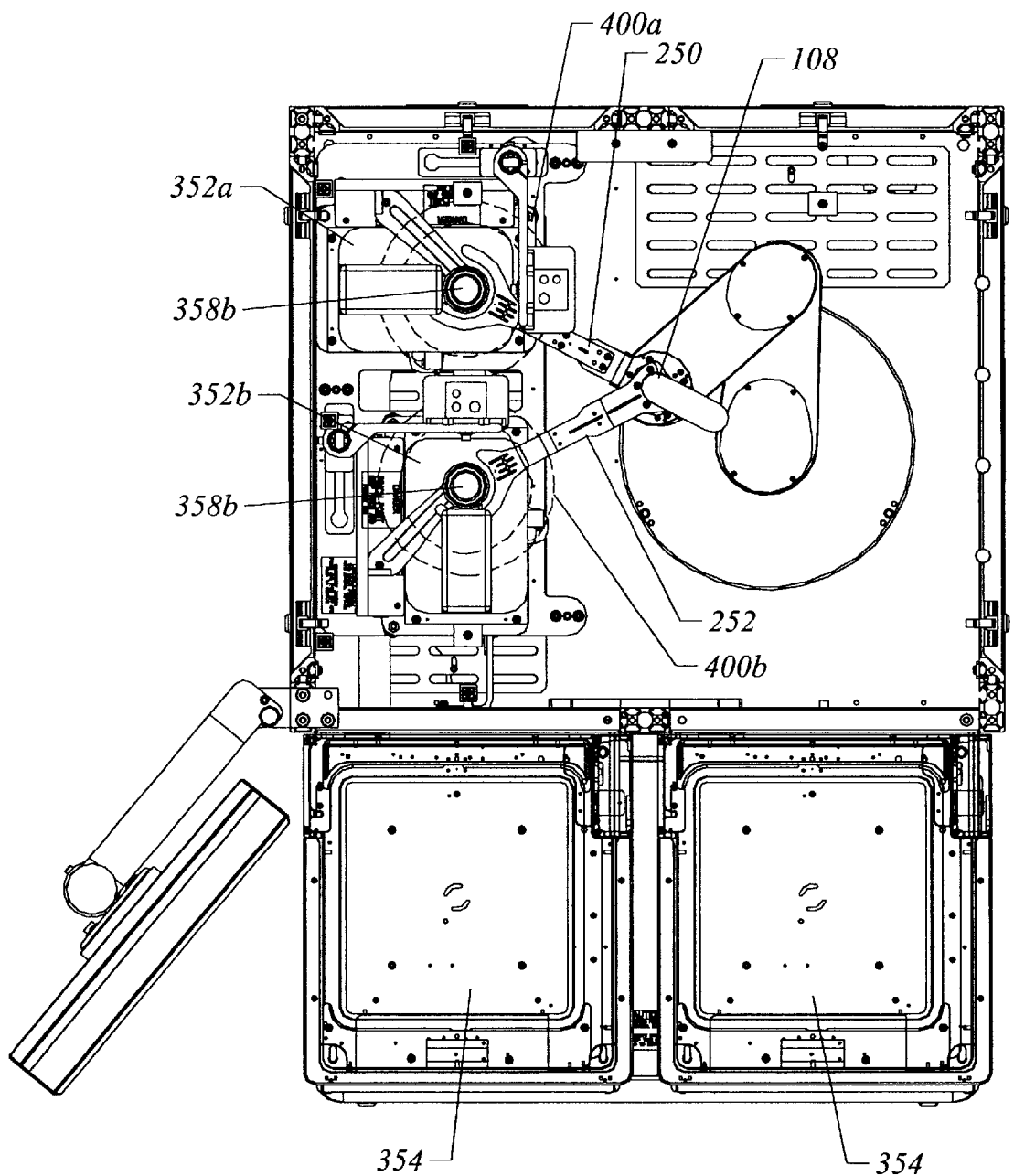
FIG. 12 is a top view of a wafer sorter according to the present invention with the workpieces advanced for placement on a pair of aligners for processing.

The dual paddle end effector 108 allows parallel processing of workpieces, such as for example within the wafer sorter shown in FIGS. 8–12. FIG. 8 is a front perspective view of the sorter; FIG. 9 is a rear perspective view with portions of the sorter omitted for clarity; and FIGS. 10–12 are top views of the interior of the sorter showing the robot 100 in different positions. In addition to robot 100 according to the present invention, wafer sorter 350 includes a pair of aligners 352a and 352b, a plurality of load port assemblies 354 (omitted from FIG. 9), a controller 356 and a graphical user interface (GUI) 357. It is understood that the wafer sorter 350 is one of many possible embodiments in which the robot 100 may be used to accomplish parallel workpiece processing.

The load port assemblies 354 may be of conventional design, such as for example as disclosed in U.S. patent application Ser. No. 08/730,643 entitled "LOAD PORT OPENER", which application is assigned to the owner of the present application and is incorporated by reference in its entirety herein. Assemblies 354 are in general provided for receiving a container such as a SMIF pod or a bar cassette, separating the cassette from the container (when a container is provided), and presenting the cassette to the robot 100 for transfer by the robot of the workpieces therein. It is understood that modular sections, each including one or more load port assemblies, may be joined together as described in U.S. patent application Ser. No. 09/547,829 filed Apr. 12, 2000, entitled "MODULAR SORTER", which application has previously been incorporated by reference.

Aligners 352a and 352b may be of conventional design, or may include buffer locations such as for example as disclosed in U.S. patent application Ser. No. 09/452,059, entitled "WAFER ORIENTING AND READING MECHANISM" ("'059 application"), which application has previously been incorporated by reference. Aligners 352, which are preferably identical to each other, are in general provided for determining a center and radial runout of the workpieces, locating the position of a notch or other fiducials mark on the workpieces, and then reading an OCR or other identifying mark provided on each workpiece. Aligner 352a and 352b each include a chuck 358a, 358b rotationally mounted within a base 360. Once the workpieces are deposited on chucks 358, the chucks rotate the respective workpieces to identify the location of the notch on each workpiece and to determine the radial runout of each workpiece. A sensor 362 of known construction is provided on each aligner for identifying both notch location and radial runout. Once the position of the notch has been identified on a workpiece, the workpiece is rotated to position the OCR mark under a video camera 364 so that the camera can read the OCR mark. Each workpiece may then be reacquired by the end effector on center as explained in greater detail below, and returned to its original cassette or to a new cassette.

In a preferred embodiment of the present invention, each aligner 352 preferably further includes a buffer paddle 365a, 365b upon which workpieces may be buffered to increase throughput of the aligners and the system in general. The buffer paddle 365 on each aligner allows the robot to bring a second workpiece to the aligner while a first workpiece is being processed, and then allows the robot to carry the first workpiece away from the aligner while the second workpiece is being processed. Thus, the aligner does not sit idle while the robot transfers workpieces to and from the aligner and the robot does not sit idle while the aligner performs its operations. It is understood that the aligners 352 may include no buffer paddle in alternative embodiments.

Referring specifically to FIGS. 10–12, in a preferred embodiment, the dual paddle end effector 108 enables parallel workpiece processing as follows. Controller 356 sends the appropriate signals to the robot drives to maneuver end effector 108 into a workpiece cassette on a load port assembly 354 so that lower paddle 250 is positioned beneath a first workpiece 400a and upper paddle is positioned beneath a second workpiece 400b immediately above workpiece 400a. Mast 116 then moves upward so that workpieces 400a and 400b are lifted off of their cassette shelves and are supported on the paddles 250 and 252, respectively. The workpieces are then simultaneously withdrawn from the cassette on end effector 108.

After acquiring two workpieces from the cassette, robot 100 transfers the two workpieces 400a and 400b to the aligners 352. In particular, the end effector 108 rotates with paddle 252 in its home position over paddle 250 until the axis 266 of lower paddle 250 is aligned through a center of chuck 358a as shown in FIG. 10. Thereafter, drive 300 will rotate, or fan out, the upper paddle 252 while the lower paddle 250 remains stationary until axis 280 of the upper paddle runs through a center of chuck 358b as shown in FIG. 11. At this point the axes 266 and 280 are parallel or substantially parallel to each other. In one embodiment of the invention, the upper paddle 252 may fan out approximately 54° with respect to the lower paddle. This angle is determined by the space between chucks 358a and 358b and the length of the paddles 250 and 252. It is understood that the fanning angle between the respective paddles 250 and 252 may vary upon a change in the space between the chucks 358 and/or a change in the length of paddles 250 and 252.

Thereafter, the robot advances end effector 108 toward the aligners 352 along axes 266 and 280 until the respective workpieces 400a and 400b are located over their respective chucks 258a and 258b as shown in FIG. 12. With axes 266 and 280 parallel to each other and to the direction of translation of end effector 108, both the "U" shaped end 264 of paddle 250 and the "C" shaped end 278 of paddle 252 may translate toward aligners 352 until they partially surround the respective chucks 358. This interengagement facilitates transfer of workpieces between the paddles 250, 252 and chucks 258a, 258b.

In a preferred embodiment, the chucks 358a and 358b are located in different horizontal planes so that, for example, chuck 358b may be at a slightly higher elevation than chuck 358a. The spacing between the horizontal planes is preferably be slightly less than the spacing between the workpieces on paddles 250, 252. Once workpieces 400a and 400b are located over chucks 358, mast 116 lowers into housing 112 to lower the end effector 108. As the vertical spacing between the planes of chucks 358a and 358b is slightly smaller than the spacing between the paddles, workpiece 400a is handed off from the lower paddle 252 to chuck 358a before workpiece 400b is handed off from the upper paddle 250 to chuck 358b.

The chucks 358a and 358b are located at different elevations so that the respective paddles 250 and 252 may reacquire both workpieces on center after the aligners have identified the center of the workpieces and have identified the OCR marks on the workpieces. In particular, with the center of both workpieces known, the controller 356 first adjusts the position of end effector 108 in a horizontal plane so that paddle 252 can move upward and reacquire workpiece 400b on center. Next, with workpiece 400b on upper paddle 252, the controller again adjusts the position of the end effector 108 in a horizontal plane so that paddle 250 can then move upward and reacquire workpiece 400a on center. In an alternative embodiment, the spacing between the horizontal planes of chucks 358a and 358b may be larger than the spacing between the paddles. In such an embodiment, first workpiece 400b and then workpiece 400a is dropped off on their respective chucks. Similarly, in this alternative embodiment, first workpiece 400a and then workpiece 400b is acquired on center from their respective chucks.

It is known to provide aligners including chucks which both rotate and translate. In such aligners, after the radial runout of the workpiece has been identified, the chuck translates while the workpiece is independently supported so that the aligner itself centers the workpiece on the chuck. Such aligners may be used with a robot according to the present invention in alternative embodiments. In such alternative embodiments, it is understood that the chucks 358 may be located in different horizontal planes as described above or in the same horizontal planes so that the wafers are deposited on and reacquired from the chucks at the same time.

After the aligner has identified the OCR mark and the paddles 250 and 252 have reacquired the workpieces 400a and 400b on center, upper paddle 252 may rotate back to its home position, and the workpieces 400a and 400b may be returned to their original cassette or a new cassette.

As indicated above, aligners 352a and 352b may include buffer paddles 365a and 365b for buffering workpieces while workpieces are seated on the chucks 358. The operation of such an embodiment for transferring workpieces between a workpiece cassette and the aligners is described in the '059 Application. However, where the '059 Application describes one workpiece being transferred at a time between a single end effector and a single aligner, the present invention may accomplish the steps described in the '059 Application while transferring two workpieces at a time between a dual paddle end effector and two separate aligners.

In such an embodiment, a first set of workpieces 400a, 400b is initially seated on chucks 358a, 358b as described above. These workpieces are then processed by the aligners 352, i.e., the workpieces are rotated to determine the radial runout of the respective workpieces and to identify the OCR marks on the workpieces. After depositing the first set of workpieces on the chucks 358, the end effector withdraws, the upper paddle 252 returns to its home position, and the robot acquires a second set of workpieces 400a, 400b from a workpiece cassette. The end effector then fans out, and deposits the second set of workpieces 400a, 400b on the buffer paddles 365a, 365b.

By the time the second set of workpieces is deposited on the buffer paddles, processing of the first set of workpieces on the chucks is completed. After depositing the second set of workpieces on the buffer paddles, the end effector withdraws, lowers, and advances again to reacquire the first set of workpieces on center from chucks 358. The end effector then withdraws, the upper paddle 252 returns to its home position, and the first set of workpieces are then returned to their original cassette or a new cassette. With the upper paddle in its home position, a third set of workpieces 400a, 400b is acquired by the robot 100 from a cassette.

While the end effector is acquiring the third set of workpieces, the buffer paddles 365 lower the second set of workpieces onto the chucks 358 for processing, and when processing is completed, the buffer paddles 365 move upward to lift the second set of workpieces back off the chucks 358. At approximately the same time this is completed, the robot returns with the third set of workpieces, deposits them on chucks 358 for processing, withdraws, moves upward, and advances again to acquire the second set of workpieces on center from the buffer paddles 365. The end effector then withdraws, the upper paddle 252 returns to its home position, and the second set of workpieces is returned to a cassette. With the upper paddle in its home position, a fourth set of workpieces 400a, 400b is acquired, and the process begins again.

It has been described above that the dual paddle end effector removes a pair of workpieces from a cassette, fans the two workpieces apart and then moves toward the aligners 352. However, it is understood that in alternative embodiments, the components within the sorter 300 are provided such that the end effector may remove a pair of workpieces from a cassette, advance over one of the aligners 352, and then fan apart the workpieces on the paddles 250 and 252. In such an embodiment, the fingers 274 and 276 on the end of upper paddle 252 will rotate into position partially around one of the chucks 258, instead of linearly advancing as described above. As such, the fingers 274 and 276 would have to be shaped to allow proper positioning of the workpiece with respect to its chuck after rotation. After processing is complete according to this embodiment, the paddles may acquire the workpieces from the buffer paddles or chucks, rotate together and then advance away from the aligners to return the workpieces to the cassette.

The figures show aligners 352 as being spaced from each other. It is understood that the aligners may alternatively be located near each other, so that workpieces supported thereon substantially overlap each other, spaced apart at least sufficiently to allow the workpiece notches and OCR marks on each workpiece to be viewed from above. Such an embodiment is disclosed in the '059 Application. The dual paddle end effector 108 may operate in such an embodiment as described above, but fan to a lesser degree than disclosed above so as to position the workpieces at the closely spaced aligners.

In the above described process using both dual paddle end effector 108 and buffer paddles 365, two workpieces may be processed while two other workpieces are in transit to or from the aligners so that operations are taking place on four workpieces simultaneously. Such a system is able to process over 600 workpieces per hour. This is more than twice the throughput of robot and aligner systems of conventional design. As indicated above, it is understood that the present invention may operate without buffer paddles 365 in alternative embodiments. Such alternative embodiments still provide a significantly greater throughput than in conventional wafer sorter systems.

In maneuvering the robot 100 around within the sorter 350, the controller 356 may use a so-called "path planning" algorithm to control the movement of robot 100. In particular, some prior art robot control algorithms first rotate the robot arm to the desired orientation, and after rotation, extend the end effector along a straight line radially out from a rotational axis of the robot to the desired position. As workpieces 400 must be removed straight out from and inserted straight into a workpiece cassette (to avoid contact with the sides of the cassette), robots employing straight line algorithms had to be moved directly in front of a cassette in order to transfer a wafer straight out of or into the cassette. It is known to mount a robot on a horizontal drive track to accomplish this.

However, where a robot is located directly in front of a load port assembly, the sides of the enclosure must be moved outward a greater amount than that required for the width of the load port assembly alone. This is true because the robot links 104 and 106 require sufficient clearance to maneuver, which required clearance is greater than the space needed for the load port assemblies alone.

However, through the use of the path planning algorithm, the robot 100 is able to move in an X-Y Cartesian plane, and in particular straight into and out of a cassette on a load port assembly 354, without being located directly in front of a load port assembly 354. This is accomplished by coordinating the radius, R, of the robot (i.e., the distance of the end effector from the axis of rotation of the robot) with the angle, θ, of the robot (i.e., the rotational position of the end effector with respect to a reference axis). In particular, by coordinating robot motion so that the proximal link rotates at the same time as the end effector translates, the end of the end effector can be controlled to move in a straight line that does not pass through the axis of rotation of the robot.

Pivoting of the support plates on which the workpiece cassettes are supported toward robot 100 further facilitates workpiece transfer between the cassette and robot end effector without the robot having to be located directly in front of the cassette. Such pivoting of the cassette support plate is known to those of skill in the art. It is understood however that in alternative embodiments, the robot 100 may operate according to straight line robotic movement algorithms where the end of the end effector moves only along radials from the center of the robot.

The above-described use of the robot 100 within sorter 350 is one of many uses of the present invention. In a further alternative embodiment, the present invention may be used within a sorter to transfer workpieces between two or more cassettes, a pair of workpieces at a time. In this embodiment, end effector 108 extends into a first cassette to extract a pair of workpieces as described above. The end effector then moves to a second cassette, enters into the cassette, and lowers downward to deposit the two workpieces on a pair of adjacent cassette shelves. In this embodiment, upper paddle 252 may remain in its home position during the entire transfer operation.

Moreover, the robot according to the present invention may be used in tools other than wafer sorters. For example, the robot 100 may be mounted within or at a front of a process tool for forming integrated circuits on wafers. In this embodiment, the robot 100 may transfer the wafers a pair at a time between cassettes loaded on the process tool and chucks within the process tool for supporting the wafers during processing.

As described above, the spacing between the upper and lower paddles is preferably the same as the pitch between workpieces within the workpiece cassette so that the workpieces are acquired from and transferred back to the cassette at substantially the same time. However, in an alternative embodiment, it is understood that the spacing between the upper and lower paddles 250, 252 on end effector 108 may be slightly less than the pitch between shelves in a cassette. This embodiment allows workpieces to be acquired from and/or transferred back to the workpiece cassette at different times. In this embodiment, during workpiece acquisition, the end effector moves upward to first acquire a workpiece 400a at a time $t_1$ on lower paddle 250, and at a time $t_2$ thereafter, the upper paddle 252 acquires the second workpiece 400b. Similarly, when returning workpieces according to this embodiment, the end effector moves downward to deposit the workpiece 400b from the upper paddle 252 at a time $t_1$ and the workpiece 400a from the lower paddle 250 at a time $t_2$ thereafter. In addition to allowing workpiece transfer between the end effector and a cassette two workpieces at a time, this embodiment allows two workpieces to be transferred from the end effector to two separate cassettes, or from two separate cassettes to the end effector. In a preferred embodiment, the workpieces within a cassette have been mapped, as for example by the load port assembly as is known in the art, so that the end effector 108 and/or the workpieces supported thereon avoid unintentional contact between workpieces within a cassette and the end effector 108 or the workpieces supported thereon.

In a further alternative embodiment of the present invention, end effector 108 may be used to extract a single workpiece from a cassette and transfer the workpiece to an aligner, another cassette or other designation as is accomplished by conventional workpiece handling robots. In this embodiment, upper paddle 252 may be rotated to a stand-by position where it is out of the way and does not interfere as robot 100 rotates over its range of motion to accomplish the desired workpiece transport. For example, a semiconductor wafer cassette generally includes 25 wafers. After the first 24 have been processed in 12 groups of two, the 25$^{th}$ and final wafer may be accessed by the single paddle 250, with the paddle 252 rotated to the stand-by position. This stand-by position will vary in alternative embodiments, depending on the particular configuration of the system in which robot 100 is used, and it may be determined experimentally by a technician when configuring the robot within the system. This feature of the present invention provides a significant advantage in that the present invention not only operates as a dual paddle end effector, but it provides the flexibility for the present invention to operate is either a dual paddle or single paddle end effector, depending on the manufacturer's particular needs.

In the embodiments described thus far, end effector 108 includes a pair of paddles capable of fanning with respect to each other. However, in a further alternative embodiment, it is contemplated that the end effector 108 include three paddles. In such an embodiment, there can be a stationary paddle on the end effector, such as paddle 250 described above, one paddle capable of fanning in a first direction with respect to the first paddle, such as paddle 252 described above, and a third paddle capable of fanning in a second direction with respect to the first paddle opposite the first direction. The third paddle may be similar to the upper and lower paddles 250, 252 described above. A second independent drive system may be added for rotating the third paddle in addition to the drive system 284 described above for rotating paddle 252. In the two paddle embodiment described above, drive system 284 is coaxial with the axis of rotation of paddle 252. In the three paddle embodiment, the two independent drives may be mounted one on top of each other coaxially with the axis of rotation, or the drives may be mounted side by side with the output torque from the drives transmitted to the individual paddles via torque transmission systems such as gear or belt mechanisms. Each of the paddles may include brackets as described above for positioning the three blades of the paddles with the desired spacing from each other. In a preferred embodiment, this spacing may be equal to the pitch between wafers within the wafer cassette, or slightly less than the wafer pitch. An embodiment including three paddles may operate to transfer workpieces three at a time between cassettes, or between a cassette and three separate work stations, such as three aligners 352. In this embodiment, it is contemplated that either one or two paddles may be moved to a standby position as described above during a given transfer operation.

In a further alternative embodiment of the present invention, end effector 108 may include two paddles, each one rotatably mounted to the end effector. In such an embodiment, two independent drives may be mounted on the end effector 108 as described above in the embodiment including three paddles. Alternatively, a single motor may be used to independently rotate the respective paddles. This embodiment is shown for example in FIGS. 13 and 14. According to the embodiment shown in FIGS. 13 and 14, the paddles 370 and 372 may include arcuate slots 374 and 376, respectively, formed near a proximal end of each paddle (i.e., the end of the paddles opposite that supporting workpieces). The slots 374 and 376 are preferably provided along a common radius, r, from an axis of rotation, and skewed with respect to each other so as to overlap from a top perspective when the paddles are aligned only at a small overlap portion 378 located at an end 380 of slot 374 and at an end 382 of slot 376.

Figure 13:
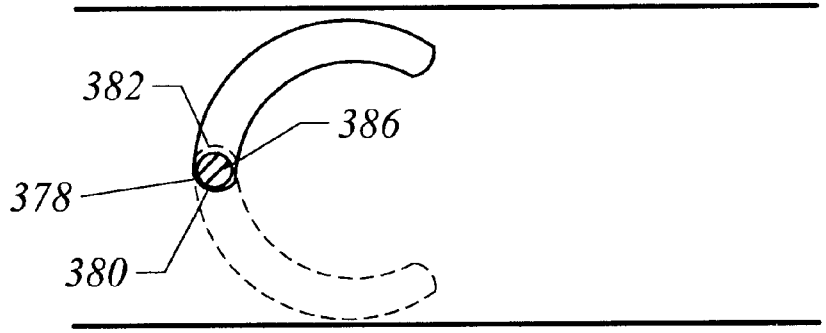
FIG. 13 is a top view of two paddles according to an alternative embodiment of the present invention.
Figure 14:
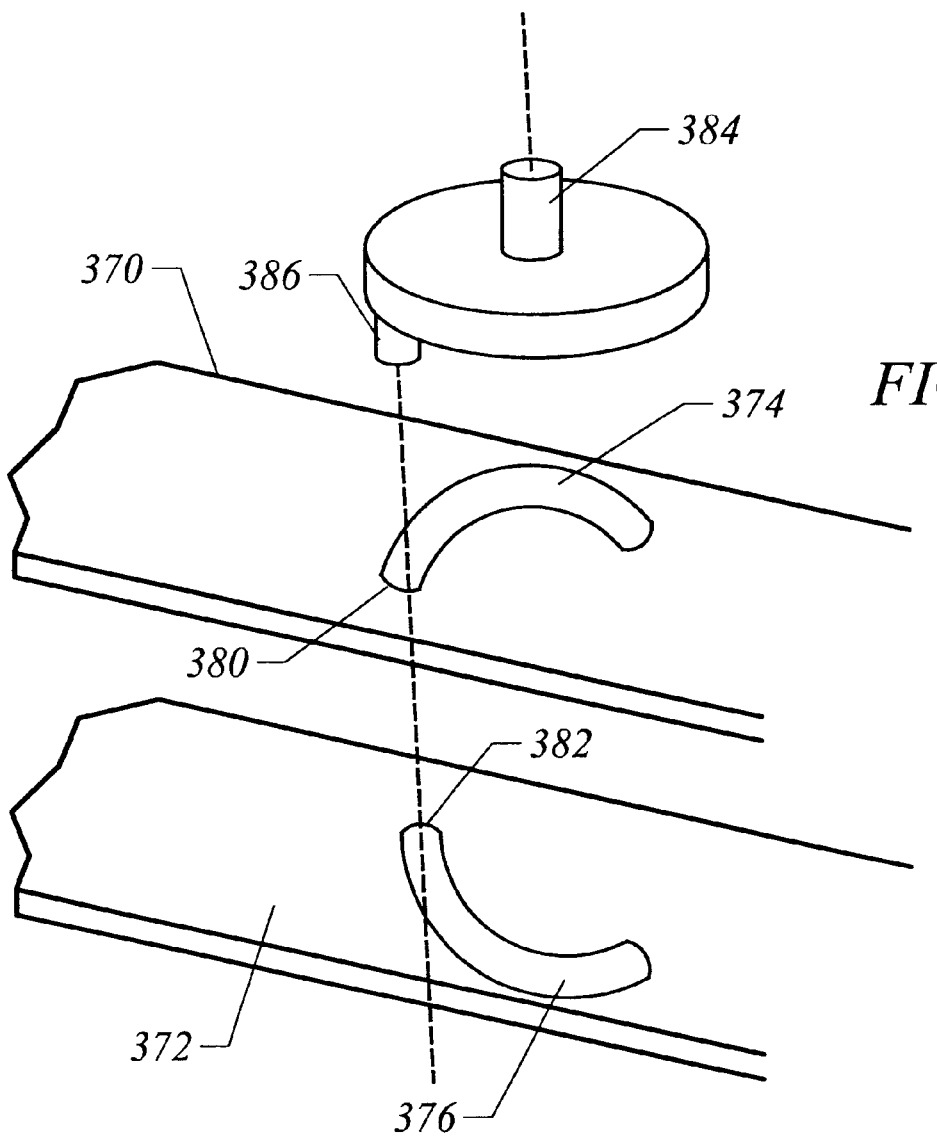
FIG. 14 is an exploded perspective view of the paddles shown in the embodiment of FIG. 13.

The embodiment shown in FIGS. 13 and 14 further includes a cam 384 mounted to the output spline of a drive assembly such as drive assembly 284 described above. The cam includes an eccentric pin 386 provided at the radius r from the axis of rotation of the drive assembly 284 and cam 384. The eccentric pin 386 extends downward and fits into each slot 374, 376, and into overlap portion 378 when the paddles are aligned with each other.

When current is passed through the motor of the drive assembly in a first direction, the output spline rotates the cam 384 in a first direction, for example clockwise. Upon clockwise rotation of the cam 384, the eccentric pin engages against the end 380 of slot 374 to drive paddle 370 clockwise. However, clockwise rotation of the cam causes the eccentric pin to merely ride freely within slot 376 and the paddle 372 therefore remains in the home position. On the other hand, when current is passed through the motor of the drive assembly in a second direction opposite the first, the output spline rotates the cam 384 in a second direction, for example counterclockwise in the above example. Upon counterclockwise rotation of the cam 384, the eccentric pin engages against the end 382 of slot 376 to drive paddle 372 counterclockwise. However, counterclockwise rotation of the cam causes the eccentric pin to merely ride freely within slot 374 and the paddle 370 remains in the home position. Both paddles may be biased to remain in the home position when not acted on by cam 384 by respective springs (not shown). Stops may further be provided which engage the respective paddles to prevent the paddles from traveling passed the home position under the biasing forces of the springs.

This embodiment further increases the flexibility provided by the present invention in that either paddle may be moved to the standby position while the other is used to access workpieces. Thus, if it is desired to access a workpiece on the lower paddle but there is no room to insert the upper paddle into the workpiece cassette, the upper paddle may be rotated to the standby position. Likewise, if it is desired to access a workpiece on the upper paddle but there is no room to insert the lower paddle into the workpiece cassette, the lower paddle may be rotated to the standby position.

It is further known to provide an end effector having multiple tines for supporting multiple workpieces thereon. One such end effector is disclosed in U.S. Pat. No. 5,647,718, entitled "STRAIGHT LINE WAFER TRANSFER SYSTEM", which patent is assigned to PRI Automation, Inc. and which patent is incorporated by reference herein in its entirety. It is contemplated that in a further alternative embodiment of the present invention, each paddle, in either a two paddle configuration or a three paddle configuration, include a plurality of tines, each tine capable of supporting a workpiece thereon. The tines on each paddle and adjacent tines on different paddles are preferably each spaced from each other the same amount. This spacing is preferably equal to the pitch of the workpieces within the workpiece cassettes, or slightly less than the workpiece pitch.

According to this embodiment, the end effector 108 may operate to transfer a plurality of workpieces at a time between cassettes. The number of tines on the paddles combined may be as high as the number of workpiece slots within a cassette, for example 25, so that the end effector can transfer the entire contents of one cassette to another cassette (appropriate mapping processes are performed to ensure that the receiving cassette does not have workpieces in positions where a workpiece is to be received). Alternatively, a plurality of workpieces may be transferred from a cassette as described above, and then the paddles fan out so as to transfer subgroups of the plurality of workpieces between two or three separate cassettes or workstations. It is understood that one paddle (in a two or three paddle configuration) or two paddles (in a three paddle configuration) may be moved to a standby position as described above during a given transfer operation.

Although the invention has been described in detail herein, it should be understood that the invention is not limited to the embodiments herein disclosed. Various changes, substitutions and modifications may be made thereto by those skilled in the art without departing from the spirit or scope of the invention as described and defined by the appended claims.

We claim:

1. A workpiece transfer robot capable of simultaneously supporting a plurality of workpieces, comprising:
    a base;
    a first link rotatable with respect to said base;
    a second link rotatable with respect to said first link; and
    an end effector rotatable with respect to said second link, said end effector including a first paddle capable of supporting a first workpiece of the plurality of workpieces and a second paddle capable of supporting a second workpiece of the plurality of workpieces, said first paddle capable of rotating with respect to said second paddle.

2. A workpiece transfer robot as recited in claim 1, said first and second paddles having a common axis of rotation.

3. A workpiece transfer robot as recited in claim 1, wherein said first paddle is fixedly mounted on said end effector and said second paddle is capable of rotation.

4. A workpiece transfer robot as recited in claim 1, wherein said first paddle is capable of rotation and said second paddle is capable of rotation.

5. A workpiece transfer robot as recited in claim 1, further comprising a third paddle mounted on said end effector capable of rotation with respect to at least one of said first and second paddles.

6. An end effector for a workpiece transfer robot, the end effector capable of simultaneously supporting a plurality of workpieces, the end effector comprising:
    a first workpiece support paddle, said first workpiece support paddle including a base;
    a second workpiece support paddle rotatably mounted to said base; and
    a drive assembly supported on said base, said drive assembly including an output shaft affixed to said second workpiece support paddle for rotating said second workpiece support paddle with respect to said first workpiece support paddle.

7. An end effector for a workpiece transfer robot as recited in claim 6, said base including a cover plate, said second workpiece support paddle being rotatably mounted to said cover plate.

8. An end effector for a workpiece transfer robot as recited in claim 7, further comprising fasteners for affixing said cover plate to said base, said fasteners capable of adjusting a planarity of said cover plate and said second workpiece support paddle with respect to said base and said first workpiece support paddle.

9. An end effector for a workpiece transfer robot as recited in claim 6, wherein a spacing between said first and second workpiece support paddles is substantially equal to a spacing of the first and second workpieces in a cassette from which the end effector acquires the first and second workpieces.

10. An end effector for a workpiece transfer robot as recited in claim 6, further comprising a sensor fixedly mounted with respect to said base for sensing when said second workpiece support paddle is aligned directly over said first workpiece support paddle.

11. An end effector for a workpiece transfer robot as recited in claim 6, further comprising a low pressure communicated through to a surface of said first workpiece support platform for securing the first workpiece on said first workpiece support platform during transport of said first workpiece.

12. An end effector for a workpiece transfer robot as recited in claim 11, further comprising a low pressure communicated through to a surface of said second workpiece support platform for securing the second workpiece on said second workpiece support platform during transport of said second workpiece.

13. An end effector for a workpiece transfer robot as recited in claim 6, wherein said drive assembly comprises a first drive assembly, the end effector further comprising a second drive assembly for rotating said first workpiece support paddle with respect to said second workpiece support paddle.

14. An end effector for a workpiece transfer robot as recited in claim 6, wherein said drive assembly is capable of rotating said second workpiece support paddle.

15. An end effector for a workpiece transfer robot as recited in claim 6, wherein said drive assembly is capable of rotating said first workpiece support paddle and said second workpiece support paddle.

16. An end effector for a workpiece transfer robot, the robot capable of transferring workpieces between a first set of support surfaces and a second set of support surfaces, the end effector comprising:
    at least a first workpiece support paddle for transferring at least a first workpiece between a support surface of the first set of support surfaces and a support surface of the second set of support surfaces; and
    at least a second workpiece support paddle for transferring at least a second workpiece between a support surface of the first set of support surfaces and a support surface of said second set of support surfaces, said at least second workpiece support paddle capable of moving with respect to said at least first workpiece support paddle;
    wherein said at least first support paddle and said at least second workpiece support paddle are capable of transferring said at least first workpiece and said at least second workpiece to said second set of support surfaces at substantially the same time.

17. An end effector for a workpiece transfer robot as recited in claim 16, wherein said at least first workpiece support paddle and said at least second workpiece support paddles are capable of fanning out with respect to each other.

18. A method of transferring workpieces between a container and a pair of support surfaces for the workpieces with a workpiece transfer robot, the robot including first and second workpiece support paddles capable of rotating with respect to each other, comprising the steps of:
    (a) acquiring a first workpiece on the first support paddle with the first and second paddles substantially aligned one on top of the other;
    (b) acquiring a second workpiece on the second support paddle with the first and second paddles substantially aligned one on top of the other;

(c) fanning the first and second support paddles with respect to each other;

(d) transferring the first workpiece to the first support surface; and (e) transferring the second workpiece to the second support surface.

19. A method of transferring workpieces between a container and a pair of support surfaces for the workpieces as recited in claim 18, wherein said step (a) of acquiring the first workpiece and said step (b) of acquiring the second workpiece occur at substantially a same time.

20. A method of transferring workpieces between a container and a pair of support surfaces for the workpieces as recited in claim 18, wherein the first and second support paddles remain substantially aligned one on top of the other between said step (b) of acquiring a second workpiece on the second support paddle and said step (e) of transferring the second workpiece to the second support surface.

21. A method of transferring workpieces between a container and a pair of support surfaces for the workpieces as recited in claim 18, further comprising the step (f) of reacquiring the first workpiece on the first support paddle from the first support surface with the first and second support paddles fanned out with respect to each other, and said (g) of reacquiring the second workpiece on the second support paddle from the second support surface with the first and second support paddles fanned out with respect to each other.

22. A method of transferring workpieces between a container and a pair of support surfaces for the workpieces as recited in claim 21, wherein said step (f) of reacquiring the first workpiece on the first support paddle occurs at a different time than said step (g) of reacquiring the second workpiece on the second support paddle.

23. A method of transferring workpieces between a container and a pair of support surfaces for the workpieces as recited in claim 21, wherein the first workpiece is reacquired on center on the first support paddle in said step (f), and the second workpiece is reacquired on center on the second support paddle in said step (g).

24. A method of transferring workpieces between a container and a pair of support surfaces for the workpieces as recited in claim 21, further comprising the step (h) of rotating the first and second support paddles until the first and second support paddles are substantially aligned one on top of the other after said step (g) of reacquiring the second workpiece on the second support paddle.

25. A method for processing workpieces, including the steps of transferring the workpieces between a container and first and second support surfaces within a processing tool with an end effector including first and second workpiece support paddles, the first support surface having a first buffer location associated therewith, and the second support surface having a second buffer location associated therewith, the method comprising the steps of:

(a) acquiring first and second workpieces from the container on the first and second workpiece support paddles with the first and second workpiece support paddles substantially aligned one on top of the other;

(b) transferring the first and second workpieces on the first and second workpiece support paddles to the first and second support surfaces;

(c) processing said first and second workpieces;

(d) acquiring third and fourth workpieces from the container on the first and second workpiece support paddles with the first and second workpiece support paddles substantially aligned one on top of the other during said step (c) of processing;

(e) transferring the third and fourth workpieces on the first and second workpiece support paddles to the first and second buffer locations;

(f) acquiring the first and second workpieces from the first and second support surfaces on said first and second workpiece support paddles;

(g) transferring the third and fourth workpieces to the first and second support surfaces;

(h) processing the third and fourth workpieces; and (i) transferring the first and second workpieces back to the container on the first and second workpiece support paddles during said step (h) of processing.

26. A method for processing workpieces as recited in claim 25, further comprising said step (j) of transferring said third and fourth workpieces back to said first and second buffer locations after said step (h) of processing.

27. A method for processing workpieces as recited in claim 25, wherein acquiring the first and second workpieces on said first and second workpiece support paddles in said step (a) occurs substantially simultaneously.

28. A method for processing workpieces as recited in claim 25, wherein transferring the first and second workpieces to the first and second support platforms in said step (b) occurs substantially simultaneously.

29. A method for processing workpieces as recited in claim 25, wherein acquiring the third and fourth workpieces on said first and second workpiece support paddles in said step (d) occurs substantially simultaneously.

30. A method for processing workpieces as recited in claim 25, wherein transferring the third and fourth workpieces to the first and second buffer locations in said step (e) occurs substantially simultaneously.

31. A method for processing workpieces as recited in claim 25, wherein acquiring the first and second workpieces on said first and second workpiece support paddles in said step (f) occurs substantially simultaneously.

32. A method for processing workpieces as recited in claim 25, wherein transferring the first and second workpieces on said first and second workpiece support paddles in said step (g) occurs substantially simultaneously.

* * * * *